US010192959B2

United States Patent
Zhao

(10) Patent No.: US 10,192,959 B2
(45) Date of Patent: Jan. 29, 2019

(54) III-N BASED SUBSTRATE FOR POWER ELECTRONIC DEVICES AND METHOD FOR MANUFACTURING SAME

(71) Applicant: IMEC VZW, Leuven (BE)

(72) Inventor: Ming Zhao, Bertem (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/817,343

(22) Filed: Nov. 20, 2017

(65) Prior Publication Data

US 2018/0212025 A1     Jul. 26, 2018

(30) Foreign Application Priority Data

Jan. 23, 2017   (EP) .................................... 17152589

(51) Int. Cl.
*H01L 29/15*      (2006.01)
*H01L 29/20*      (2006.01)
(Continued)

(52) U.S. Cl.
CPC ........ *H01L 29/152* (2013.01); *H01L 21/0254* (2013.01); *H01L 21/02458* (2013.01);
(Continued)

(58) Field of Classification Search
CPC . H01L 29/152; H01L 29/2003; H01L 29/205; H01L 29/207; H01L 21/02458;
(Continued)

(56) References Cited

U.S. PATENT DOCUMENTS 6,872,967 B2    3/2005 Kano et al.
7,652,282 B2    1/2010 Yanagihara
(Continued)

OTHER PUBLICATIONS

Chunhua Zhou et al. "Vertical leakage/breakdown mechanisms in AlGaN/GaN-on-Si devices", IEEE Electron Device Letters, vol. 33, No. 8, pp. 1332-1334, Aug. 2012.*
(Continued)

*Primary Examiner* — Cuong Q Nguyen
*Assistant Examiner* — Tong-Ho Kim
(74) *Attorney, Agent, or Firm* — McDonnell Boehnen Hulbert & Berghoff LLP

(57) ABSTRACT

The present disclosure relates to a III-N based substrate for power electronic devices, comprising a base substrate, a III-N laminate above the base substrate and a buffer layer structure between the base substrate and the III-N laminate. The buffer layer structure comprises at least a first superlattice laminate and a second superlattice laminate above the first superlattice laminate. The first superlattice laminate comprises a repetition of a first superlattice unit which consists of a plurality of first AlGaN layers. The second superlattice laminate comprises a repetition of a second superlattice unit which consists of a plurality of second AlGaN layers. An average aluminum content of the first superlattice laminate is a predetermined difference greater than an average aluminum content of the second superlattice laminate, to improve the vertical breakdown voltage. The present disclosure also relates to a method for manufacturing a III-N based substrate for power electronic devices.

20 Claims, 7 Drawing Sheets

(51) Int. Cl.
*H01L 29/205* (2006.01)
*H01L 29/207* (2006.01)
*H01L 21/02* (2006.01)

(52) U.S. Cl.
CPC .... *H01L 21/02507* (2013.01); *H01L 29/2003* (2013.01); *H01L 29/205* (2013.01); *H01L 29/207* (2013.01); H01L 21/0242 (2013.01); H01L 21/02378 (2013.01); H01L 21/02381 (2013.01)

(58) Field of Classification Search
CPC ........... H01L 21/02507; H01L 21/0254; H01L 21/02378; H01L 21/02381; H01L 21/0242
USPC .......................................... 257/615; 438/478
See application file for complete search history.

(56) References Cited

U.S. PATENT DOCUMENTS

| | | | |
|---|---|---|---|
| 8,405,064 | B2 | 3/2013 | Yamaguchi et al. |
| 8,742,396 | B2 | 6/2014 | Ooshika |
| 9,111,839 | B2 | 8/2015 | Hoteida et al. |
| 9,166,031 | B2 | 10/2015 | Kotani et al. |
| 2012/0223328 | A1 | 9/2012 | Ikuta et al. |
| 2013/0334495 | A1 | 12/2013 | Lim et al. |
| 2013/0334496 | A1 | 12/2013 | Kim et al. |
| 2014/0045284 | A1* | 2/2014 | Tak .................... H01L 21/02381 438/27 |
| 2014/0209862 | A1* | 7/2014 | Ikuta ................. H01L 29/66462 257/22 |
| 2016/0149000 | A1* | 5/2016 | Sazawa ................ C30B 29/403 257/18 |
| 2016/0359004 | A1* | 12/2016 | Su ...................... H01L 21/02458 |

OTHER PUBLICATIONS

Wang, T. et al., "Highly Improved Performance of a 350 nm Ultraviolet Light-Emitting Diode Containing AlxGA1-xN/AlyGa1-yN Distributed Bragg Reflectors", Journal of Crystal Growth, vol. 267, 2004, pp. 583-587.

Xin-Xin, Yu et al., "AlGaN/GaN HEMTs on 4-Inch Silicon Substrates in the Presence of 2.7-um-Thick Epilayers With the Maximum Off-State Breakdown Voltage of 500 V", Chin. Phys. Lett., vol. 31, No. 3, 2014, pp. 1-4.

Pan, Lei et al., "Growth of Compressively-Strained GaN Films on Si(111) Substrates With Thick AlGaN Transition and AlGaN Superlattice Buffer Layers", Phys. Status Solidi C, vol. 13, No. 5-6, 2016, pp. 181-185.

Nakada, Naoyuki et al., "Suppression of Crack Generation in GaN/AlGaN Distributed Bragg Reflector on Sapphire by the Insertion of GaN/AlGaN Superlattice Grown by Metal-Organic Chemical Vapor Deposition", Jpn. J. Appl. Phys., vol. 42, 2003, pp. 144-146.

\* cited by examiner

III-N BASED SUBSTRATE FOR POWER ELECTRONIC DEVICES AND METHOD FOR MANUFACTURING SAME

CROSS-REFERENCE TO RELATED APPLICATIONS

The present application is a non-provisional patent application claiming priority to European Patent Application No. 17152589.2, filed Jan. 23, 2017, the contents of which are hereby incorporated by reference.

FIELD OF THE DISCLOSURE

The present disclosure relates to a III-N based substrate for power electronic devices and a method for manufacturing such a substrate.

BACKGROUND

One of the major requirements for III-N material based high voltage power devices is that the device stack needs to be highly electrically resistive with a high leakage current blocking capability. This leakage current blocking capability is usually evaluated with the voltage at a vertical leakage current density of 1 μA/mm² at both room temperature (25° C.) and a high temperature (typically 150° C.) when the structure is biased vertically with both polarities. Due to a lack of native substrates, the III-N material based devices are usually grown on foreign substrates, such as Si, sapphire, and SiC by using metal organic vapor phase epitaxy (MOVPE) or molecular beam epitaxy (MBE). This type of hetero-epitaxy process then requires growth of buffer layers which manage the lattice mismatch introduced stress so that the device active layers can be grown with satisfactory material quality and electric properties. In addition, the stress management buffer layers can in most cases also contribute to the leakage blocking capability of the full stack.

One common practice to enhance the stack leakage blocking capability is to simply increase the buffer thickness. A superlattice (SL) buffer is a type of buffer structure which usually consists of multiple repetitions/periods of AlN/$Al_xGa_{1-x}$N (0=<x<1) pair layers. For growth of a device stack on a Si substrate with a SL buffer, the SL buffer must be very thick (3-4 μm) to provide sufficient leakage blocking capability. Such thicknesses lead to difficulties in providing sufficient in situ convex wafer bow in order to compensate for thermal mismatch introduced concave wafer bowing during post-epitaxy cooling.

From US 2012/223328 A1, a group III-nitride epitaxial laminate substrate is known comprising a substrate, a buffer, and a main laminate in this order, wherein the buffer includes an initial growth layer, a first superlattice laminate, and a second superlattice laminate in this order. The first superlattice laminate includes five to 20 sets of first AlN layers and second GaN layers, the first AlN layers, and the second GaN layers being alternately stacked, and each one set of the first AlN layer and the second GaN layer has a thickness of less than 44 nm. The second superlattice laminate includes a plurality of sets of first layers made of an AlN material or an AlGaN material and second layers made of an AlGaN material having a different band gap from the first layers, the first and second layers being alternately stacked. The dual superlattice laminate structure is used to achieve both an improvement in crystallinity and a suppression of substrate warpage.

SUMMARY

It is an aim of this disclosure to provide a III-N based substrate for power electronic devices which enables a buffer structure with improved leakage blocking capability, i.e. with an improved vertical breakdown voltage.

In particular, it is an aim of this disclosure to provide a III-N based substrate for power electronic devices which enables a buffer structure with sufficient leakage blocking capability and which enables substrate warpage to be kept within acceptable limits.

It is another aim of this disclosure to provide a method for manufacturing such III-N based substrates.

In an aspect of the present disclosure, a III-N based substrate for power electronic devices is presented, the III-N based substrate comprising a base substrate, a III-N laminate above the base substrate and a buffer layer structure between the base substrate and the III-N laminate. The buffer layer structure comprises at least a first superlattice laminate and a second superlattice laminate above the first superlattice laminate. The first superlattice laminate comprises a repetition of a first superlattice unit which consists of a plurality of first AlGaN layers, each of which is made of $Al_xGa_{1-x}$N with 0≤x≤1 and x being different among the first AlGaN layers. The second superlattice laminate comprises a repetition of a second superlattice unit which consists of a plurality of second AlGaN layers, each of which is made of $Al_yGa_{1-y}$N with 0≤y≤1 and y being different among the second AlGaN layers. An average aluminum content of the first superlattice laminate is a predetermined difference greater than an average aluminum content of the second superlattice laminate. According to the present disclosure, the predetermined difference may improve a breakdown voltage of the III-N based substrate for power electronic devices. The buffer layer structure is provided to compensate for lattice mismatch and to control wafer bow.

It has been found that the first or lower superlattice laminate with a higher average aluminum content than the second or upper superlattice laminate can enhance the breakdown voltage (to compare: the breakdown field of AlN, 12E6 V/cm, is about 4 times higher than that of GaN, 3.3E6 V/cm). It has been found that in embodiments of the present disclosure, as a result of a predetermined difference in aluminum content, a breakdown field strength of more than 150 V/μm in forward and/or reverse vertical bias may be achieved at room temperature (25° C.).

In embodiments of the present disclosure, the predetermined difference in aluminum content may control substrate warpage at room temperature (25° C.) to be within acceptable limits, e.g., below 50 μm for a substrate of 200 mm in diameter.

It has been found that the higher average aluminum content (or equivalent aluminum content) in the first (lower) superlattice laminate than in the second (upper) superlattice laminate can simultaneously contribute to controlling the substrate warpage as well as with improving the buffer breakdown voltage already at comparably small stack thickness, compared to a buffer which has only a single superlattice laminate. This is because having a lower average aluminum content in the upper superlattice laminate than the lower superlattice laminate introduces additional compressive stress into the stack which can compensate the tensile stress introduced during the cooling.

For each first superlattice unit of the first superlattice laminate, x may be different between pairs of adjacent (i.e. abutting) first AlGaN layers. For instance, for a first superlattice unit consisting of a first first AlGaN layer, a second first AlGaN layer, and a third first AlGaN layer, x may be different between the first first and the second first AlGaN layers and x may be different between the second first and the third first AlGaN layer. Correspondingly, for each second superlattice unit of the second superlattice laminate, y may be different between pairs of adjacent second AlGaN layers. For instance, for a second superlattice unit consisting of a first second AlGaN layer, a second second AlGaN layer and a third second AlGaN layer, y may be different between the first second and the second second AlGaN layers and y may be different between the second second and the third second AlGaN layer.

In embodiments of the present disclosure, the average aluminum content of the first superlattice laminate is at least 30%.

In embodiments of the present disclosure, the predetermined difference in average aluminum content is at least 5%. This means that, for example, if the first superlattice laminate has an average aluminum content of 30%, the second superlattice laminate has an average aluminum content of 25% or below. In example embodiments, the difference in average aluminum content between adjacent superlattice laminates is kept at a minimum while still satisfying the wafer warp control requirement, so that both (or all) superlattice laminates in the entire stack can have high aluminum content to maximize the Vbd capability.

In embodiments of the present disclosure, the buffer layer structure may comprise at least one additional superlattice laminate on top of the second superlattice laminate, wherein each additional superlattice laminate comprises a repetition of a respective third superlattice unit which consists of a plurality of respective third AlGaN layers, each of which is made of $Al_iGa_{1-i}N$ with $0 \le i \le 1$ and i being different among the respective third AlGaN layers of the respective third superlattice unit; and wherein the average aluminum content of the first superlattice laminate is at least 5% greater than the average aluminum content of the second superlattice laminate, and the average aluminum content of the second superlattice laminate is at least 5% greater than the average aluminum content of the additional superlattice laminate. The average aluminum content of the first, second and additional superlattice laminates may hence decrease from bottom to top with a minimum of 5% difference in average aluminum content between adjacent superlattice laminates.

In embodiments of the present disclosure, the average aluminum content of the additional superlattice laminate is at least 5%.

The superlattice laminates may be formed directly on top of each other, i.e., without any interface layers.

In embodiments, the superlattice units may each consist of a bottom layer of AlN with an AlGaN layer on top. In such embodiments, the variation in average aluminum content between the superlattice units of the different superlattice laminates may be achieved by a variation in the aluminum content of the top layer, or by a variation in the thickness of the top layer while keeping the aluminum content of this layer constant, by a combination of both a variation in thickness and aluminum content, or otherwise. So for example, the equivalent aluminum content can also be changed by modifying the AlN layer thickness while keeping the same composition and thickness for the top AlGaN layer. The same principles can be applied to superlattice units having more, or different layers: the overall structure can be kept the same or similar while simply varying the aluminum content and/or thickness of one of the AlGaN layers to influence the average aluminum content of the superlattice unit and hence the superlattice laminate (which is a repetition of the unit).

In embodiments of the present disclosure, the thickness of at least one superlattice laminate should be high enough to allow sufficient strain relaxation of the superlattice laminate, which corresponds to the thickness where the slope of the wafer in situ curvature appreciably decreases. The thickness depends on the average aluminum content as well as the layer structure within the superlattice laminate. In these embodiments, at least one superlattice laminate may have a thickness at which the compressive stress starts to relax, which corresponds to the thickness where the slope of the wafer in situ curvature appreciably decreases. For example, a thickness for at least one superlattice laminate may be the at least the thickness at which the slope of the in situ wafer curvature drops below 0.015 km$^-$/s). The above may further apply to each one of the superlattice laminates.

In embodiments of the present disclosure, an at least partial strain relaxation is present in the buffer layer structure, between at least one adjacent pair of layers of the first and/or the second superlattice laminate. The strain relaxation may be of any degree within a range of partial to full strain relaxation. By strain relaxation is hereby meant relaxation of the in-plane strain. Having an at least partial strain relaxation between two mutually abutting layers of at least one of the superlattice laminates enables the buffer layer structure to be formed with a greater thickness: During growth of the buffer layer structure compressive strain may accumulate and an in situ curvature of the base substrate may increase. If the in situ curvature is increased beyond a critical amount (the precise value being base substrate specific) plastic deformation of the base substrate may occur. By having an at least partial strain relaxation in at least one of the superlattice laminates, the rate of increase of the in situ curvature may be reduced such that a thicker buffer layer structure may be formed without reaching the limit for plastic deformation.

Adjacent pairs of layers of the first and/or the second superlattice laminate, other than adjacent pair of at least partially strain relaxed layers, may be pseudomorphic layers. By a pseudomorphic layer pair is hereby meant a pair of a lower layer and an upper layer wherein the (in-plane) lattice constant of the upper layer matches the (in-plane) lattice constant of the lower layer.

In embodiments of the present disclosure, the first, second and/or additional superlattice units may consist of at least three AlGaN layers and/or may consist of at most five AlGaN layers. The aluminum content of the layers may be arbitrarily chosen for other reasons such as to further control wafer warpage, as long as the average aluminum content of the superlattice units (and hence the laminates) is within the ranges defined for the embodiments of the present disclosure.

In embodiments of the present disclosure, the first, second and/or additional superlattice units have a layer of AlN, for example the bottom layer.

In embodiments of the present disclosure, the first, second, and/or additional superlattice units have a layer of $Al_jGa_{1-j}N$, with $0<j\le0.5$, for example an upper layer.

In embodiments of the present disclosure, one or more layers selected from the first, second, and/or additional superlattice laminates may contain impurity atoms to further improve breakdown voltage. The impurity atom concentration may be higher than $1\times10^{18}$ [atoms/cm$^3$]. The impurity atoms can be one or more species selected from the group consist of C atoms, Fe atoms, Mn atoms, Mg atoms, V atoms, Cr atoms, Be atoms, and B atoms. The impurity atoms may be C atoms or Fe atoms.

In another aspect, which may be combined with the other aspects described herein, the present disclosure provides a method for manufacturing a III-N based substrate for power electronic devices, comprising the steps of: providing a base substrate; growing a buffer layer structure on the base substrate; and growing a III-N laminate on the buffer layer structure; wherein the buffer layer structure comprises at least a first superlattice laminate and a second superlattice laminate above the first superlattice laminate. The first superlattice laminate comprises a repetition of a first superlattice unit which consists of a plurality of first AlGaN layers, each of which is made of $Al_xGa_{1-x}N$ with $0 \le x \le 1$ and x being different among the first AlGaN layers. The second superlattice laminate comprises a repetition of a second superlattice unit which consists of a plurality of second AlGaN layers, each of which is made of $Al_yGa_{1-y}N$ with $0 \le y \le 1$ and y being different among the second AlGaN layers. Upon growing the buffer layer structure, process conditions are controlled such that an average aluminum content of the first superlattice laminate is a predetermined difference greater than an average aluminum content of the second superlattice laminate. By predetermined difference a breakdown voltage of the III-N based substrate for power electronic devices may be improved.

The details and embodiments discussed in connection with the above aspect relating to the III-N based substrate, may apply correspondingly to the present method aspect. Reference is therefore made to the above.

It has been found that the process conditions can be controlled such that the first or lower superlattice laminate has a higher average aluminum content than the second or upper superlattice laminate, to such an extent that the breakdown voltage can be enhanced. It has been found that in embodiments of the present disclosure, as a result of a predetermined difference in aluminum content, a breakdown field strength of at least 150 V/μm in forward and/or reverse vertical bias may be achieved.

In embodiments of the present disclosure, the predetermined difference in aluminum content may control substrate warpage at room temperature (25° C.) to be within acceptable limits, e.g., below 50 μm for a substrate of 200 mm in diameter. It has been found that the higher average aluminum content (or equivalent aluminum content) in the first (lower) superlattice laminate than in the second (upper) superlattice laminate can simultaneously contribute to controlling the substrate warpage as well as with improving the buffer breakdown voltage with a reduced stack thickness, compared to a buffer which has only a single superlattice laminate. This is because having a lower average aluminum content in the upper superlattice laminate than the lower superlattice laminate introduces additional compressive stress into the stack which can compensate the tensile stress introduced during the cooling.

In embodiments according to the present disclosure, the III-N material based substrates are grown on foreign substrates, such as Si, sapphire, and SiC by using metal organic vapor phase epitaxy (MOVPE) or molecular beam epitaxy (MBE).

In embodiments according to the present disclosure, the buffer layer structure is grown such that an at least partial strain relaxation occurs between at least one adjacent pair of layers of the first and/or the second superlattice laminate. The strain relaxation may be of any degree within a range of partial to full strain relaxation. By strain relaxation is hereby meant relaxation of the in-plane strain. Having an at least partial strain relaxation between two layers of at least one of the superlattice laminates enables the buffer layer structure to be formed with a greater thickness, as discussed above.

Adjacent pairs of layers of the first and/or the second superlattice laminate, other than adjacent pair of at least partially strain relaxed layers, may be pseudomorpically grown.

BRIEF DESCRIPTION OF THE FIGURES

The above, as well as additional, features will be better understood through the following illustrative and non-limiting detailed description of example embodiments, with reference to the appended drawings.

The disclosure will be further elucidated by means of the following description and the appended drawings.

Figure 1:
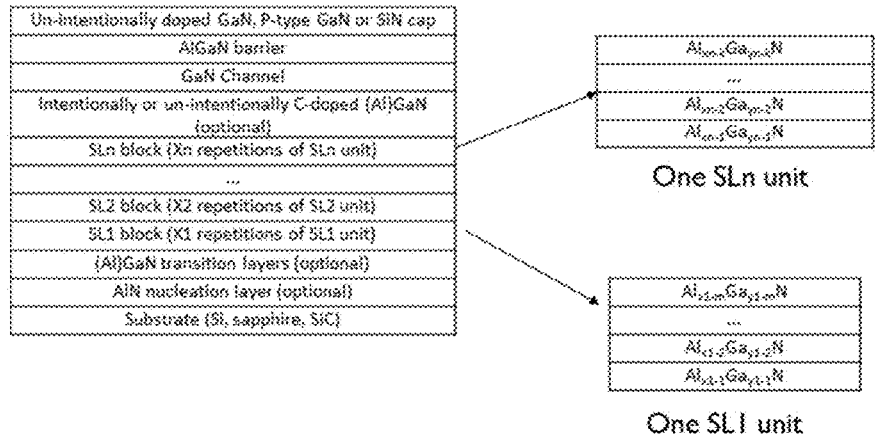
FIG. 1 shows a schematic example of GaN-based power HEMT (or Diode) stack with a stepped-SL buffer, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third, and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, above, over, under, and the like in the description and the claims are used for descriptive purposes and not necessarily for describing relative positions. The terms so used are interchangeable under appropriate circumstances and the embodiments of the disclosure described herein can operate in other orientations than described or illustrated herein. For instance, the terms above and below may refer to directions along and opposite to, respectively, a normal direction to (a main plane of extension or a main surface of) the base substrate (or any of the layers formed thereon).

Furthermore, the various embodiments are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

In this disclosure, a stepped-superlattice (SL) buffer scheme is presented, embodiments of which can be not only more efficient in enhancing the leakage blocking capability in terms of buffer thickness but also more efficient in introducing in situ convex wafer bow compared with a traditional SL buffer.

The stepped-SL buffer scheme may comprise multiple blocks or laminates of SL structures. An example of GaN-based power HEMT (or Diode) stack with such a stepped-SL buffer is shown schematically in FIG. 1. As shown, each SL laminate consists of a repetition of an SL unit, which in turn consists of a plurality of AlGaN layers, in example embodiments, three to five AlGaN layers. The base substrate may be a foreign substrate to III-N materials, for example a Si, sapphire, or SiC substrate. Optional nucleation and/or transition layers may be provided in between the base substrate and the SL laminates. On top of the upper SL laminate, i.e., below the GaN channel layer, an optional further (Al)GaN layer may be provided, which may be intentionally or un-intentionally C-doped.

Figure 2:
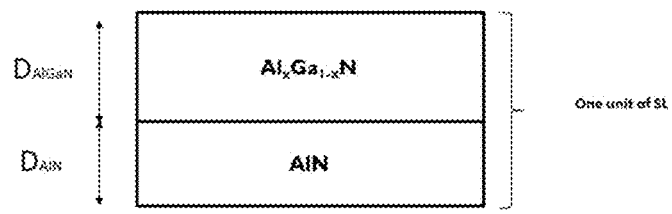
FIG. 2 shows an example of the formula for calculating equivalent aluminum content, according to an example embodiment.

In SL1 laminate, the equivalent (average) Al % of SL1 laminate is $Al_{eq-1}$%. In SLn laminate, the equivalent (average) Al % of SLn laminate is $Al_{eq-n}$%. The equivalent Al % of SLn is calculated using the formula for which an example is shown in FIG. 2 for a SL unit consisting of a layer of AlN with thickness of $D_{AlN}$ and a layer of $Al_xGa_{1-x}N$ with thickness of $D_{AlGaN}$. Throughout the present disclosure, the index "x", "y", "z" or the like refers to atomic percentage.

In embodiments according to this disclosure, It is required that $Al_{eq-n}$%<$Al_{eq-(n-1)}$%<$Al_{eq-(n-2)}$%<$Al_{eq-(n-3)}$%< . . . < $Al_{eq-1}$% (hence the terminology "stepped-superlattice buffer"), such that the SL laminates with a higher $Al_{eq}$% can be more effective in enhancing the leakage blocking capability while a higher in situ convex wafer bow can be introduced between each SL laminate. The SL laminates may have a C concentration≥1E18 cm$^{-3}$ to further increase the electric resistance.

In the following, experimental results are presented which prove the effectiveness of the stepped SL buffer, by way of comparative examples. All examples are grown on 200 mm Si substrates.

Figure 3:
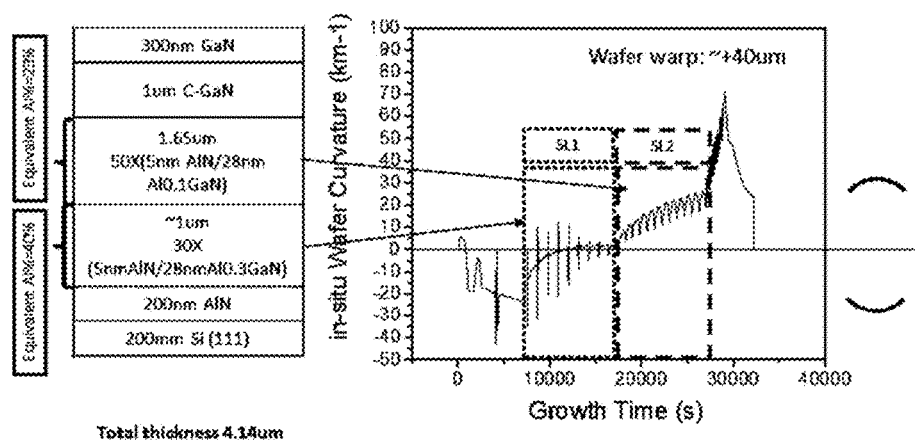
FIG. 3 shows a first example according to the present disclosure, with two SL laminates, wherein the difference in equivalent Al % is achieved by varying the Al content in the top layer of the SL units, according to an example embodiment.

FIG. 3 shows a first example according to the present disclosure. The stack schematic shows two SL laminates in this buffer structure where the total stack thickness is ~4 μm (200 nm AlN nucleation layer+1 μm SL1+1.65 μm SL2+1 μm C—GaN+300 nm GaN, which is the total stack that contributes to the total vertical Vbd). The SL1 laminate has an equivalent Al % of 40.6% and SL2 laminate has 23.6%. Both the SL1 and SL2 laminates consist of repetitions of SL units consisting of an AlN layer (5 nm) with an $Al_xGa_{1-x}N$, respectively $Al_yGa_{1-y}N$ layer on top (28 nm). The difference in equivalent Al % is achieved by varying the Al content in the top layer: in this example x is 0.3 while y is 0.1. SL1 consists of 30 repetitions; SL2 consists of 50 repetitions. The figure on the right is the in situ wafer curvature recorded during the growth of this stack, where the sharp spikes and short range high frequency oscillations of the curves are the artefacts of the measurement system. The positive curvature represents a convex wafer shape and negative curvature represents a concave wafer shape. According to the Stoney equation, the slope of the in situ wafer curvature is proportional to the in-plane stress at the growth front. A positive slope indicates a compressive in-plane stress and a negative slope indicates a tensile in-plane stress. The in situ wafer curvature indicates that throughout the SL growth, a compressive stress can be maintained which can effectively compensate the tensile stress during the cooling and minimize the epitaxial wafer warp. Especially, a clear increase of the slope of the in situ curvature can be seen when SL2 laminate starts to grow. This is due to the lattice mismatch introduced compressive stress when growing the SL2 laminate on the SL1 laminate because the equivalent Al % in the SL2 laminate is less than in the SL1 laminate (for an $Al_xGa_{1-x}N$ layer, the smaller x is, the lager lattice constant is) while the compressive strain of SL1 laminate is already sufficiently relaxed before growing SL2 laminate. The regions indicated by the dashed boxes represent in situ curvature during growth of SL1 and SL2 laminates, respectively.

The final epitaxial wafer warp (at room temperature, i.e. 25° C.) is +40 μm. The positive sign of the warp follows the same as for in situ curvature (i.e., convex wafer shape). For device processing in a 200 mm Si CMOS line, typical SPEC for wafer warp is ≤±50 μm and a positive warp is more favorable for the stability of epitaxial wafer integrity. So the wafer warp achieved in this first example is within acceptable limits.

Figure 4:
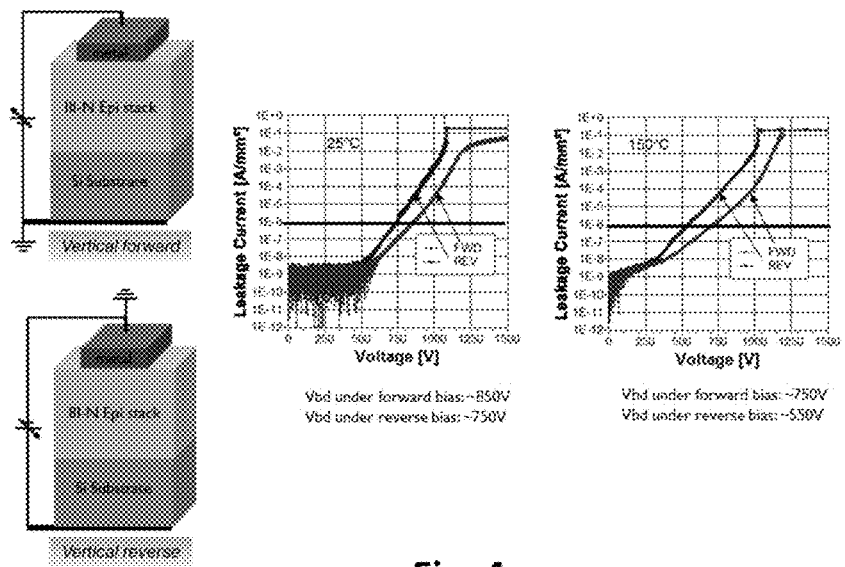
FIG. 4 shows, for the structure of FIG. 3, the vertical buffer breakdown (Vbd) measurement results at 25° C. and 150° C., according to an example embodiment.

FIG. 4 shows the vertical buffer breakdown (Vbd) measurement results at 25° C. and 150° C. The measurement method is illustrated on the left where, square (100 μm×100 μm) metal dots were processed on the samples by Ti/Au metallization and lift-off. The buffer breakdown voltage is defined as the voltage where the leakage current reaches 1 µA/mm². The measurements prove a high breakdown voltage even though the total buffer structure thickness is only 4.14 µm.

Figure 5:
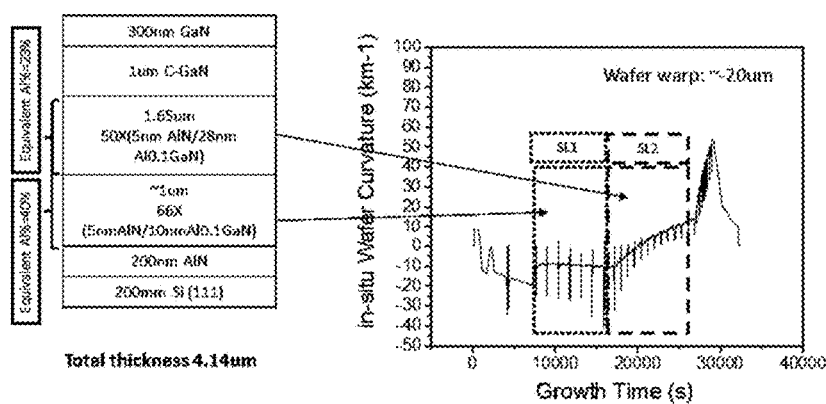
FIG. 5 shows a second example according to the present disclosure, with two SL laminates, wherein the difference in equivalent Al % is achieved by varying the thickness of the top layer of the SL units, according to an example embodiment.

FIG. 5 shows a second example according to the present disclosure. The stack schematic shows two SL laminates in this buffer structure where the total thickness is ~4 µm. The SL1 laminate has an equivalent Al % of 40.0% and SL2 laminate has 23.6%. Both the SL1 and SL2 laminates consist of repetitions of SL units consisting of an AlN layer (5 nm) with an $Al_xGa_{1-x}N$, respectively $Al_yGa_{1-y}N$ layer on top (10 nm, respectively 28 nm). In this example x=y=0.1 and the difference in equivalent Al % is achieved by varying the thickness of the top layer. SL1 consists of 66 repetitions; SL2 consists of 50 repetitions. The figure on the right is the in situ wafer curvature recorded during the growth of this stack, where the sharp spikes and short range high frequency oscillations of the curves are the artefacts of the measurement system. The positive curvature represents a convex wafer shape and negative curvature represents a concave wafer shape. According to the Stoney equation, the slope of the in situ wafer curvature is proportional to the in-plane stress at the growth front. A positive slope indicates a compressive in-plane stress and a negative slope indicates a tensile in-plane stress. The in situ wafer curvature indicates that throughout the SL growth, a compressive stress can be maintained which can effectively compensate the tensile stress during the cooling in order to minimize the epitaxial wafer warp. Especially, a clear increase of the slope of the in situ curvature can be seen when SL2 laminate starts to grow. This is due to the lattice mismatch introduced compressive stress when growing SL2 on SL1 laminate because the equivalent Al % in SL2 laminate is less than SL1 laminate (while the compressive strain of SL1 laminate is already sufficiently relaxed before growing SL2 laminate), even though the Al % in the AlGaN layer in both SL1 and SL2 laminates is the same. The regions indicated by the dashed boxes represent in situ curvature during growth of SL1 and SL2 laminates, respectively.

The final epitaxial wafer warp (after cooling) is about −20 µm. The positive sign of the warp follows the same as for in situ curvature (i.e. convex wafer shape). For device processing in a 200 mm Si production line, typical SPEC for wafer warp is ≤±50 m and a positive warp is more favorable for the stability of epitaxial wafer integrity. So the final warp is within acceptable limits.

Figure 6:
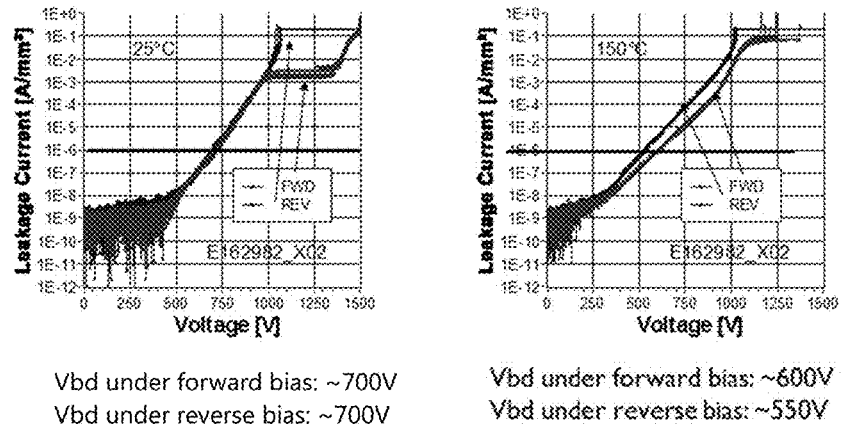
FIG. 6 shows, for the structure of FIG. 5, the vertical buffer breakdown (Vbd) measurement results at 25° C. and 150° C., according to an example embodiment.

FIG. 6 shows the vertical buffer breakdown (Vbd) measurement results at 25° C. and 150° C. The measurements prove a high breakdown voltage even though the total buffer structure thickness is only 4.14 µm.

Figure 7:
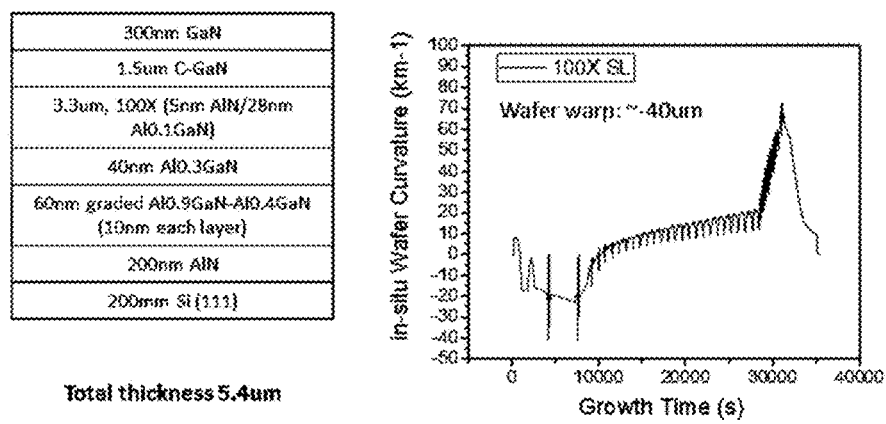
FIG. 7 shows a reference stack with a single SL laminate, according to an example embodiment.
Figure 8:
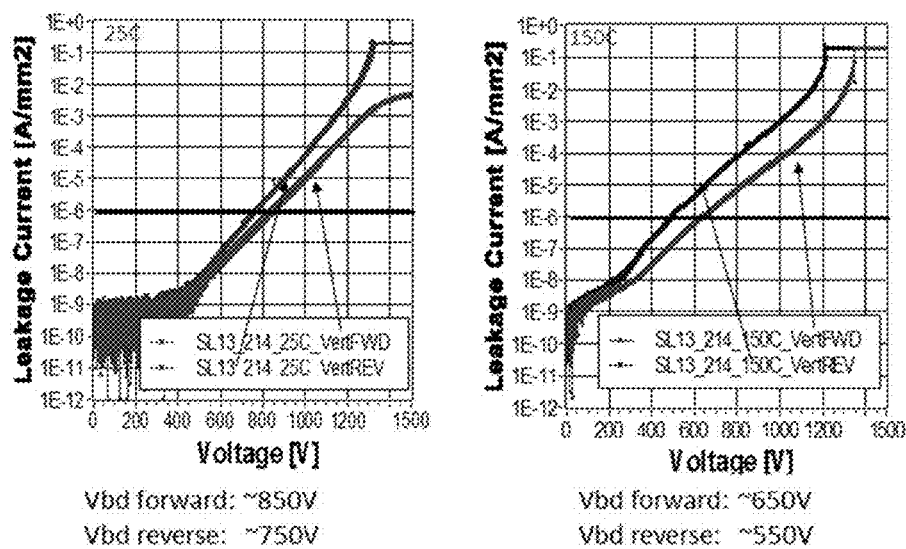
FIG. 8 shows, for the structure of FIG. 7, the vertical buffer breakdown (Vbd) measurement results at 25° C. and 150° C., according to an example embodiment.

As a reference, a stack with a single SL laminate is shown in FIGS. 7 and 8. The SL laminate consists of 100 repetitions of the same SL unit as the SL2 laminate in examples 1 and 2, namely an AlN layer (5 nm) with an AlGaN layer on top (28 nm) with 10% Al. The total stack thickness is ~5.4 µm. Because it has only one SL laminate, there is no additional compressive stress introduced during SL growth, and the wafer warp at room temperature (25° C.) is ~−40 µm which is also less favorable. Although the Vbd of this stack is similar to that of the examples 1 and 2, its thickness is much higher. As a result, the breakdown field strength of the reference stack is in comparison much lower.

Figure 9:
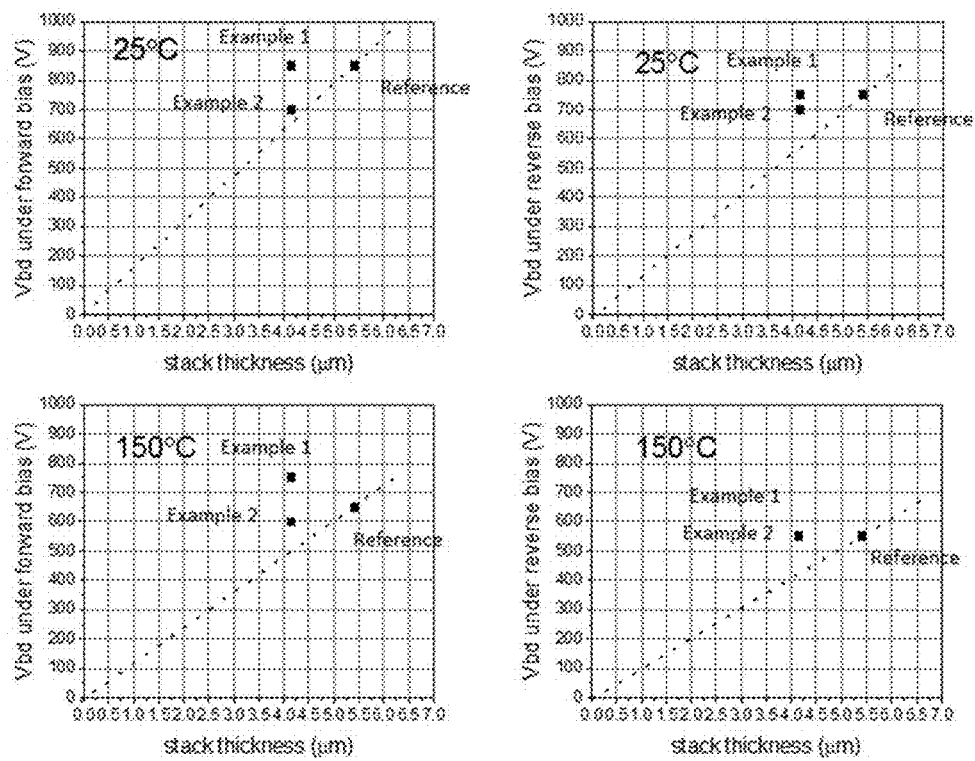
FIG. 9 shows a summary of the Vbd measurements of the two examples of FIG. 3 and FIG. 5 and the reference under both bias polarities and at 25° C. and 150° C., respectively, according to example embodiments.

FIG. 9 shows a summary of the Vbd measurements of the two examples and the reference under both bias polarities and at 25° C. and 150° C., respectively. The figure clearly shows that the breakdown field strength is much higher for the two examples than the reference under all conditions, especially at 150° C.

Figure 10:
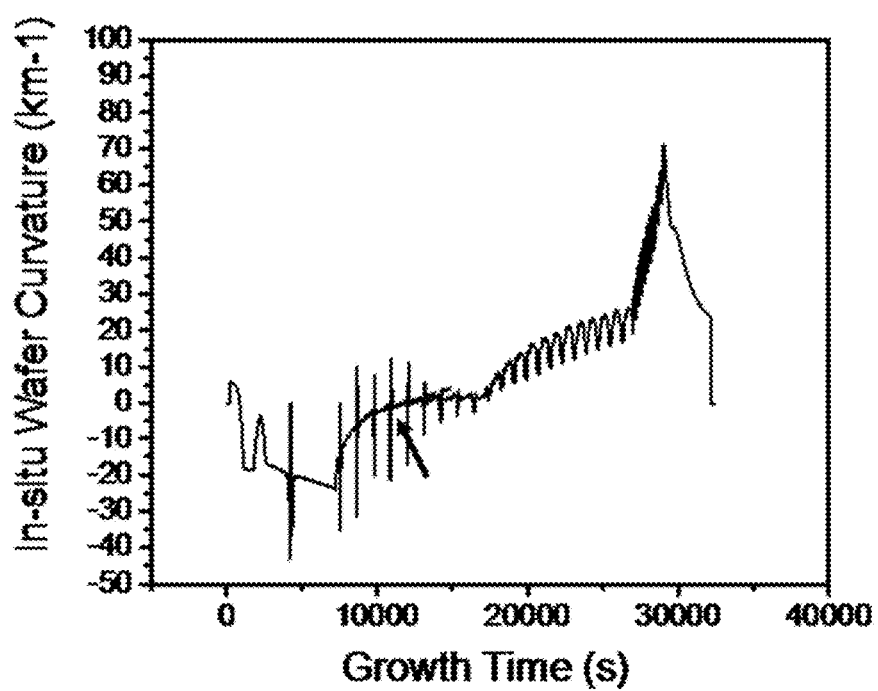
FIG. 10 shows the variation of the in situ wafer curvature over time during construction of an embodiment of a stepped-SL buffer, according to example embodiments.

FIG. 10 is provided as an explanation for the thickness of at least one superlattice laminate, which may be enough to allow sufficient strain relaxation of the superlattice laminate. The sharp spikes and short range high frequency oscillations of the curves are the artefacts of the measurement system. The thickness corresponds to the thickness where the slope of the wafer in situ curvature appreciably decreases (the addition of SL units is continued at least until the slope of the in situ wafer curvature drops below 0.015 km$^{-1}$/s). This thickness depends on the average aluminum content of as well as the layer structure of the superlattice laminate. The figure gives an example: the arrow indicates where the slope of the in situ wafer curvature is considered as appreciably decreasing, so where a suitable thickness for the strain relaxation has been obtained.

It should be noted that FIG. 10 merely represents one example and that the growth of the buffer layer structure may be performed such that an at least partial in-plane strain relaxation occurs between one adjacent pair of layers within a lower, middle, or top portion of the first or the second superlattice laminate. The pair may include a lower layer and an upper layer formed on the lower layer wherein the upper layer, during the growth of the buffer layer structure, becomes or is formed to be at least partially strain relaxed with respect to the lower layer. The strain relaxation may be achieved for instance by growing the upper layer to a thickness exceeding a critical layer thickness. Alternatively, the upper layer may be grown as a pseudomorphic layer (i.e. thinner than the critical thickness) and subsequently, following growth of further layers on top, become partially strain relaxed. Strain relaxation may occur at one or more positions within the first superlattice laminate and/or within the second superlattice laminate. All other layers of the superlattice laminate(s) may form pseudomorphic layers. For instance, in the example of FIG. 5 it may be seen that that strain relaxation occurs already in a lower portion of the SL1.

Following completion and cooling of the III-N substrate, an at least partial strain relaxation may be present in the buffer layer structure, between (at least) the lower and adjacent upper layer. The lattice mismatch induced in-plane strain f for an adjacent lower and upper layer may be defined as $f=(c_L-c_U)/c_U$, where $c_L$ is the in-plane lattice constant of the lower layer and $c_U$ is the relaxed in-plane lattice constant of the upper layer. For a pseudomorphic upper layer, the in-plane lattice constant of the upper layer matches the in-plane lattice constant of the lower layer.

In the above the inventive concept has mainly been described with reference to a limited number of examples. However, as is readily appreciated by a person skilled in the art, other examples than the ones disclosed above are equally possible within the scope of the inventive concept, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A III-N based substrate for power electronic devices comprising:
   a base substrate;
   a III-N laminate above the base substrate; and
   a buffer layer structure between the base substrate and the III-N laminate,
   wherein the buffer layer structure comprises at least a first superlattice laminate and a second superlattice laminate above the first superlattice laminate,
   wherein the first superlattice laminate comprises a repetition of a first superlattice unit which comprises a plurality of first AlGaN layers, each of which is made of $Al_xGa_{1-x}N$ with $0 \leq x \leq 1$ and x being different among the first AlGaN layers,
   wherein the second superlattice laminate comprises a repetition of a second superlattice unit which comprises a plurality of second AlGaN layers, each of which is made of $Al_yGa_{1-y}N$ with $0 \leq y \leq 1$ and y being different among the second AlGaN layers,
   wherein an average aluminum content of the first superlattice laminate is greater than an average aluminum content of the second superlattice laminate by a predetermined difference, and
   wherein the buffer layer structure has a breakdown field strength of more than 150 V/μm in forward or reverse vertical bias at room temperature (25° C.).

2. The III-N based substrate according to claim 1, wherein the base substrate comprises SiC.

3. The III-N based substrate according to claim 1, wherein the predetermined difference controls substrate warpage at room temperature (25° C.) to be below 50 μm for a substrate of 200 mm in diameter.

4. The III-N based substrate according to claim 1, wherein an at least partial strain relaxation is present in the buffer layer structure, between at least one adjacent pair of layers of the first superlattice laminate or the second superlattice laminate.

5. The III-N based substrate according to claim 1, wherein the average aluminum content of the first superlattice laminate is at least 30%.

6. The III-N based substrate according to claim 1, wherein the average aluminum content of the second superlattice laminate is below 25%.

7. The III-N based substrate according to claim 1, wherein the predetermined difference is at least 5%.

8. The III-N based substrate according to claim 1,
   wherein the buffer layer structure comprises at least one additional superlattice laminate on top of the second superlattice laminate,
   wherein each additional superlattice laminate comprises a repetition of a respective third superlattice unit which comprises a plurality of respective third AlGaN layers, each of which is made of $Al_iGa_{1-i}N$ with $0 \leq i \leq 1$ and i being different among the respective third AlGaN layers of the respective third superlattice unit,
   wherein the average aluminum content of the first superlattice laminate is at least 5% greater than the average aluminum content of the second superlattice laminate, and
   wherein the average aluminum content of the second superlattice laminate is at least 5% greater than an average aluminum content of the at least one additional superlattice laminate.

9. The III-N based substrate according to claim 8, wherein the average aluminum content of the at least one additional superlattice laminate is at least 5%.

10. The III-N based substrate according to claim 8, wherein the first superlattice unit, the second superlattice unit, or an additional superlattice unit comprises at least three AlGaN layers.

11. The III-N based substrate according to claim 10, wherein the first superlattice unit, the second superlattice unit, or a third superlattice unit comprises a layer of $Al_jGa_{1-j}N$, with $0 \leq j \leq 0.5$.

12. The III-N based substrate according to claim 8, wherein the first superlattice unit, the second superlattice unit or an additional superlattice unit comprises a layer of AlN.

13. The III-N based substrate according to claim 8, wherein one or more layers selected from the first superlattice laminate, the second superlattice laminate, or one of the at least one additional superlattice laminates comprises impurity atoms.

14. The III-N based substrate according to claim 13, wherein the impurity atoms are one or more species selected from the group consisting of C atoms, Fe atoms, Mn atoms, Mg atoms, V atoms, Cr atoms, Be atoms, and B atoms.

15. The III-N based substrate according to claim 14, wherein the impurity atoms are C atoms or Fe atoms.

16. A method for manufacturing a III-N based substrate for power electronic devices, comprising the steps of:
    providing a base substrate;
    growing a buffer layer structure on the base substrate; and
    growing a III-N laminate on the buffer layer structure,
    wherein the buffer layer structure comprises at least a first superlattice laminate and a second superlattice laminate above the first superlattice laminate,
    wherein the first superlattice laminate comprises a repetition of a first superlattice unit which comprises a plurality of first AlGaN layers, each of which is made of $Al_xGa_{1-x}N$ with $0 \leq x \leq 1$ and x being different among the first AlGaN layers,
    wherein the second superlattice laminate comprises a repetition of a second superlattice unit which consists of a plurality of second AlGaN layers, each of which is made of $Al_yGa_{1-y}N$ with $0 \leq y \leq 1$ and y being different among the second AlGaN layers
    wherein upon growing the buffer layer structure, process conditions are controlled such that an average aluminum content of the first superlattice laminate is greater than an average aluminum content of the second superlattice laminate by a predetermined difference, and
    wherein the buffer layer structure has a breakdown field strength of more than 150 V/μm in forward or reverse vertical bias at room temperature (25° C.).

17. The method according to claim 16, wherein the first superlattice unit and the second superlattice unit have the same layer structure except for a variation in a respective thickness of at least one of the AlGaN layers to influence the average aluminum content of the superlattice units and hence the superlattice laminates.

18. The method according to claim 16, wherein for at least one superlattice laminate, growth of superlattice units is at least continued until a slope of an in situ wafer curvature drops below 0.015 $km^{-1}/s$.

19. The method according to claim 16, wherein the buffer layer structure is grown such that an at least partial strain relaxation occurs between at least one adjacent pair of layers of the first superlattice laminate or the second superlattice laminate.

20. The method according to claim 16, wherein the base substrate comprises SiC.

\* \* \* \* \*